(12) United States Patent
Yao et al.

(10) Patent No.: US 11,811,400 B1
(45) Date of Patent: Nov. 7, 2023

(54) CIRCUIT FOR IMPROVING LINEARITY AND CHANNEL COMPENSATION OF PAM4 RECEIVER ANALOG FRONT END

(71) Applicant: JOYWELL SEMICONDUCTOR (SHANGHAI) CO., LTD., Shanghai (CN)

(72) Inventors: Yufeng Yao, Shanghai (CN); Minqing Cai, Shanghai (CN); Haonan Wang, Shanghai (CN); Yunlong Ge, Shanghai (CN); Seung Chul Lee, Shanghai (CN)

(73) Assignee: JOYWELL SEMICONDUCTOR (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 18/248,654

(22) PCT Filed: Apr. 18, 2022

(86) PCT No.: PCT/CN2022/087354
§ 371 (c)(1),
(2) Date: Apr. 11, 2023

(87) PCT Pub. No.: WO2022/222881
PCT Pub. Date: Oct. 27, 2022

(30) Foreign Application Priority Data

Apr. 21, 2021 (CN) .......................... 202110431596.0

(51) Int. Cl.
*H03K 19/01* (2006.01)
*H03K 19/0185* (2006.01)

(52) U.S. Cl.
CPC ................................ *H03K 19/0185* (2013.01)

(58) Field of Classification Search
CPC ............. G01R 19/0038; H03K 5/2418; H03K 5/2445; H03K 5/2481; H03F 3/45;
(Continued)

(56) References Cited

U.S. PATENT DOCUMENTS

2010/0164624 A1* 7/2010 Hung .................. H03F 3/45183
330/261
2012/0154045 A1* 6/2012 Tsai ......................... H03F 3/72
330/253
(Continued)

FOREIGN PATENT DOCUMENTS

CN 103825617 A 5/2014
CN 104660227 A 5/2015
(Continued)

OTHER PUBLICATIONS

International Search Report (with English translation) and Written Opinion issued in PCT/CN2022/087354, dated Jul. 1, 2022, 8 pages provided.

*Primary Examiner* — Quan Tra
(74) *Attorney, Agent, or Firm* — HAMRE, SCHUMANN, MUELLER & LARSON, P.C.

(57) ABSTRACT

The present invention discloses a circuit for improving linearity and channel compensation of PAM4 receiver analog front end, comprising a first stage and a second stage, the first stage comprising first to twentieth transistors, a first resistor, a pair of second resistors, a pair of first capacitors, and a pair of second capacitors. In the first stage circuit, the ninth and tenth transistors are directly coupled to the ground, eliminating the electrical connection to the bias current source. The Input terminals of the ninth and tenth transistors are coupled to the output signals of the preceding nineteenth and twentieth transistors, so that the ninth and tenth transistors serve as both input pairs and current source transistors. The overall current is limited by the thirteenth and fourteenth transistors, which results in a lower power supply voltage for the first stage consisting of the ninth through fourteenth transistors.

10 Claims, 2 Drawing Sheets

(58) Field of Classification Search
CPC ............. H03F 3/45179; H03F 3/45183; H03F 3/45188; H03F 3/45192; H03F 2200/177
USPC .......................................... 327/65, 108–112
See application file for complete search history.

(56) References Cited

U.S. PATENT DOCUMENTS

2018/0183521 A1    6/2018  Zhang et al.
2022/0399863 A1*  12/2022  Mohammed ........ H03F 3/45475

FOREIGN PATENT DOCUMENTS

| CN | 111431618 A | 7/2020 |
| CN | 111565030 A | 8/2020 |

\* cited by examiner

CIRCUIT FOR IMPROVING LINEARITY AND CHANNEL COMPENSATION OF PAM4 RECEIVER ANALOG FRONT END

TECHNICAL FIELD

The present invention generally relates to the field of integrated circuit technology, and particularly to a circuit for improving linearity and channel compensation of PAM4 receiver analog front end.

BACKGROUND

PAM4 signal is a popular signal transmission technology for high-speed signal interconnection in the next-generation data center, which can be widely used in the transmission of electrical or optical signals in 200G/400G interfaces.

As the data transmission speed gradually increases, the data transmission channel exhibits significant attenuation. Different application scenarios result in different signal amplitudes reaching the PAM4 receiver analog front end, and since PAM4 signal is composed of four different levels of signals, it puts forward requirements for the amplitude of the four different level signals. The difference in amplitude between the four different level signals is also known as the linearity of the PAM4 receiver analog front end. After compensating for the channel attenuation of the PAM4 receiver analog front end, the size of the four level signal amplitudes output determines the linearity, which poses a significant challenge. On the other hand, PAM4 receiver analog front end needs zero points at different frequencies to compensate for the attenuation of the channel at different frequencies and increase the bandwidth of the PAM4 analog front end.

With the advancement of process node, the voltage that transistors can withstand is gradually decreasing, which brings significant difficulties to the design of high-speed PAM4 circuit analog front ends.

SUMMARY

The purpose of the present invention is to provide a circuit for improving linearity and channel compensation of PAM4 receiver analog front end, which enables the circuit to operate at low voltage and expand the circuit bandwidth.

The present invention discloses a circuit for improving linearity and channel compensation of PAM4 receiver analog front end, comprising a first stage which comprises: first to twentieth transistors, a first resistor, a pair of second resistors, a pair of first capacitors, and a pair of second capacitors; wherein, the drain and gate of the first transistor, the gate of the second transistor, one end of each of the pair of second resistors, the gate of the seventeenth transistor and the gate of the eighteenth transistor are coupled with a bias current;

the drain of the second transistor, the drain of the third transistor, the gate of the fourth to sixth transistors are coupled to the gate of the thirteenth to sixteenth transistors;

the gate of the third transistor is coupled with a common mode voltage;

the source of the fourth to sixth transistors, the source of the thirteenth to sixteenth transistors, one end of each of the pair of first capacitors are coupled with a voltage source;

the drain of the fifth and fifteenth transistors, the source of the nineteenth transistor, one end of one of the pair of first capacitors is coupled to one end of the first resistor, the drain of the sixth and sixteenth transistors, the source of the twentieth transistor, one end of the other of the pair of first capacitors is coupled to the other end of the first resistor;

the drain of the nineteenth transistor, the gate of the ninth and eleventh transistors are coupled to the drain of the seventh and seventeenth transistors, the drain of the twentieth transistor, the gate of the tenth and twelfth transistors are coupled to the drain of the eighth and eighteenth transistors;

the gate of the seventh transistor is coupled to the other end of one of the pair of second resistors and one end of one of the pair of second capacitors, the gate of the eighth transistor is coupled to the other end of the other of the pair of second resistors and one end of the other of the pair of second capacitors;

the gate of the nineteenth transistor and the other end of one of the pair of second capacitors are coupled to the in-phase input signal, the gate of the twentieth transistor and the other end of the other of the pair of second capacitors are coupled to the anti-phase input signal;

the source of the eleventh and twelfth transistors are coupled to the drain of the thirteenth and fourteenth transistors, the drain of the eleventh transistor is coupled to the drain of the ninth transistor and outputs a first-stage in-phase output signal, the drain of the twelfth transistor is coupled to the drain of the tenth transistor and outputs a first-stage anti-phase output signal;

the source of the first, second, seventh to tenth, seventeenth and eighteenth transistors are coupled to ground.

In a preferred embodiment, the pair of first capacitors are variable capacitors, and the first resistor is a variable resistor.

In a preferred embodiment, the pair of second capacitors are variable capacitors, and the pair of second resistors are variable resistors.

In a preferred embodiment, the first stage further comprises a pair of third resistors, wherein one of the pair of third resistors is coupled in series between the drain and gate of the eleventh transistor, and the other of the pair of third resistors is coupled in series between the drain and gate of the twelfth transistor.

In a preferred embodiment, the first stage further comprises a pair of first inductors, wherein one of the pair of first inductors is coupled in series between the drain and gate of the eleventh transistor, and the other of the pair of first inductors is coupled in series between the drain and gate of the twelfth transistor.

In a preferred embodiment, the circuit further comprises a second stage which comprises: twenty-first through fortieth transistors, a fourth resistor, a pair of fifth resistors, a pair of fourth capacitors, and a pair of fifth capacitors; wherein, the drain and gate of the twenty-first transistor, the gate of the twenty-second transistor, one end of each of the pair of fifth resistors, and the gates of the thirty-fifth through thirty-eighth transistors are coupled to a bias current;

the drain of the twenty-second transistor, the drain of the twenty-third transistor, and the gates of the twenty-fourth through twenty-six transistors are coupled;

the gate of the twenty-third transistor is coupled to a common mode voltage;

the sources of the twenty-fourth through twenty-six transistors, the sources of the thirty-third through thirty-four transistors, and one end of each of the pair of fourth capacitors are coupled to a voltage source;

the drain of the twenty-fifth transistor, the source of the thirty-ninth transistor, and the other end of one of the pair of fourth capacitors are coupled to one end of the fourth resistor, and the drain of the twenty-sixth transistor, the source of the fortieth transistor, and the other end of the other of the pair of fourth capacitors are coupled to the other end of the fourth resistor;

the drain of the thirty-ninth transistor and the gates of the twenty-ninth and thirty-first transistors are coupled to the drains of the twenty-seventh and thirty-seventh transistors, and the drain of the fortieth transistor, the gates of the thirtieth and thirty-second transistors are coupled to the drains of the twenty-eighth and thirty-eighth transistors;

the gate of the twenty-seventh transistor is coupled to the other end of one of the pair of fifth resistors and one end of one of the pair of fifth capacitors, and the gate of the twenty-eighth transistor is coupled to the other end of the other of the pair of fifth resistors and one end of the other of the pair of fifth capacitors;

the gate of the thirty-ninth transistor and the other end of one of the pair of fifth capacitors are coupled to the first-stage in-phase output signal, and the gate of the fortieth transistor and the other end of the other of the pair of fifth capacitors are coupled to the first-stage anti-phase output signal;

the sources of the thirty-first and thirty-second transistors are coupled to the drains of the thirty-third and thirty-fourth transistors, and the drain of the thirty-first transistor is coupled to the drain of the twenty-ninth transistor to output the second-stage in-phase output signal, and the drain of the thirty-second transistor is coupled to the drain of the thirtieth transistor to output the second-stage anti-phase output signal;

the sources of the twenty-first, twenty-second, twenty-seventh, twenty-eighth, thirty-fifth through thirty-eighth transistors are coupled to ground.

In a preferred embodiment, the second stage further comprises a pair of sixth resistors, wherein one of the pair of sixth resistors is coupled in series between the drain and gate of the thirty-first transistor, and the other of the pair of sixth resistors is coupled in series between the drain and gate of the thirty-second transistor.

In a preferred embodiment, the second stage further comprises a pair of second inductors, wherein one of the pair of second inductors is coupled in series between the drain and gate of the thirty-first transistor, and the other of the pair of second inductors is coupled in series between the drain and gate of the thirty-second transistor.

In a preferred embodiment, the second stage further comprises a pair of sixth capacitors, wherein one of the pair of sixth capacitors is coupled between the gate of the thirty-first transistor and the drain of the thirty-second transistor, and the other of the pair of sixth capacitors is coupled between the drain of the thirty-first transistor and the gate of the thirty-second transistor.

In a preferred embodiment, the second stage further comprises a comparator, whose output terminal is coupled to the gate of the thirty-third and thirty-fourth transistors, whose first input terminal is coupled to a reference voltage, and whose second input terminal is coupled to the second-stage anti-phase output signal or the second-stage in-phase output signal.

Advantages of the present invention over the prior art include:

In order to make the circuit work at low voltage, M9/M10 in the first stage eliminates the current source of M29/M30 in the second stage, and M9/M10 is directly coupled to ground. The input of M9/M10 is coupled to the output signal of the front stage M19/M10, making M9/M10 both an input pair and a current source, and the overall passing current is limited by M13/M14, which can make the power supply voltage of the stage where M9/M10/M11/M12/M13/M14 is located lower.

The current source for the source of M7/M8 in the first stage circuit is eliminated and M7/M8 is directly coupled to ground, allowing the circuit to operate at low power supply voltage. The input terminal of M7/M8 in the first stage circuit is coupled to the bias voltage through R2/R2' and to the input signal through C2/C2', so that M7/M8 are both bias current transistors and an input pair. This circuit structure provides an additional zero point. The first stage circuit is composed of a structure of bias voltage, R2/R2', C2/C2' and M7/M8, and adjusting the size of R2/R2' and C2/C2' can provide zero points at different frequencies. Similarly, in the second stage circuit, adjusting the size of R5/R5' and C5/C5' in the structure composed of bias voltage, R5/R5', C5/C5' and M27/M28 can provide zero points at different frequencies.

The use of front low-voltage structure and variation of bias current of M15/M16/M17/M18 in the first stage circuit can change the gain at low frequencies of this stage.

In the first stage structure, M7/M8 constitutes the NMOS input stage, and the DC operating point of M7/M8 is the bias voltage. Due to the presence of C2/C2', there is a zero point in the input of M7/M8, and high-frequency signals can be amplified through M7/M8, while low-frequency signals cannot pass through C2/C2' and can only be amplified through the input differential pair M19/M20 above, resulting in degradation of the linearity of the amplified signal. Similarly, in the second stage circuit, changing the size or type of M37/M38 can optimize the output signal linearity.

Due to the large output load capacitance, in order to improve the bandwidth, a new zero point is formed in addition to the zero point provided by the inductor in the second stage structure, which is composed of M31/M32 and M29/M30 differential pair, R6/R6', L2/L2' and C6/C6' variable capacitor, and the frequency of this zero point can be changed with the size of C6/C6'. When the bandwidth requirement is met, the inductor L2/L2' can be removed and a new zero point can be formed by only M31/M32 and M29/M30 differential pair, R6/R6' and C6/C6' variable capacitor, thus expanding the output bandwidth of the circuit.

In the PVT situation, in order to stabilize the output common-mode voltage, the output stage is composed of M33/M34, the comparator output common-mode voltage, and the input reference voltage to form a feedback circuit.

This specification contains numerous technical features distributed among various technical solutions. Listing all possible combinations of these technical features (i.e., technical solutions) would make the specification too lengthy. To avoid this problem, the technical features disclosed in the above-mentioned invention content, the technical features disclosed in various embodiments and examples in the following text, and the technical features disclosed in the drawings can all be freely combined to form various new technical solutions (which should be considered as already disclosed in this specification), unless such combinations of technical features are technically infeasible. For example, if feature A+B+C is disclosed in one example and feature A+B+D+E is disclosed in another example, and features C and D are equivalent technical means that serve the same purpose, only one of them can be chosen for technical reasons and cannot be used simultaneously. Feature E can be combined with feature C from a technical perspective. Therefore, the A+B+C+D solution should not be considered as already disclosed because it is technically infeasible, while the A+B+C+E solution should be considered as already disclosed.

DETAILED DESCRIPTION

The various aspects and examples of the present invention will now be described. The following description provides specific details for understanding and implementing these examples.

However, those skilled in the art will understand that the present invention can be practiced without many of these details.

Additionally, some well-known structures or functions may not be described in detail in order to avoid unnecessarily obscuring the relevant description.

The terms used in the description below are intended to be interpreted in their broadest reasonable manner, even if used in conjunction with a detailed description of specific examples of the present invention. Certain terms may be emphasized in the following description; however, any terms intended to be interpreted in any restricted manner will be explicitly and specifically defined in this detailed description section.

Figure 1:
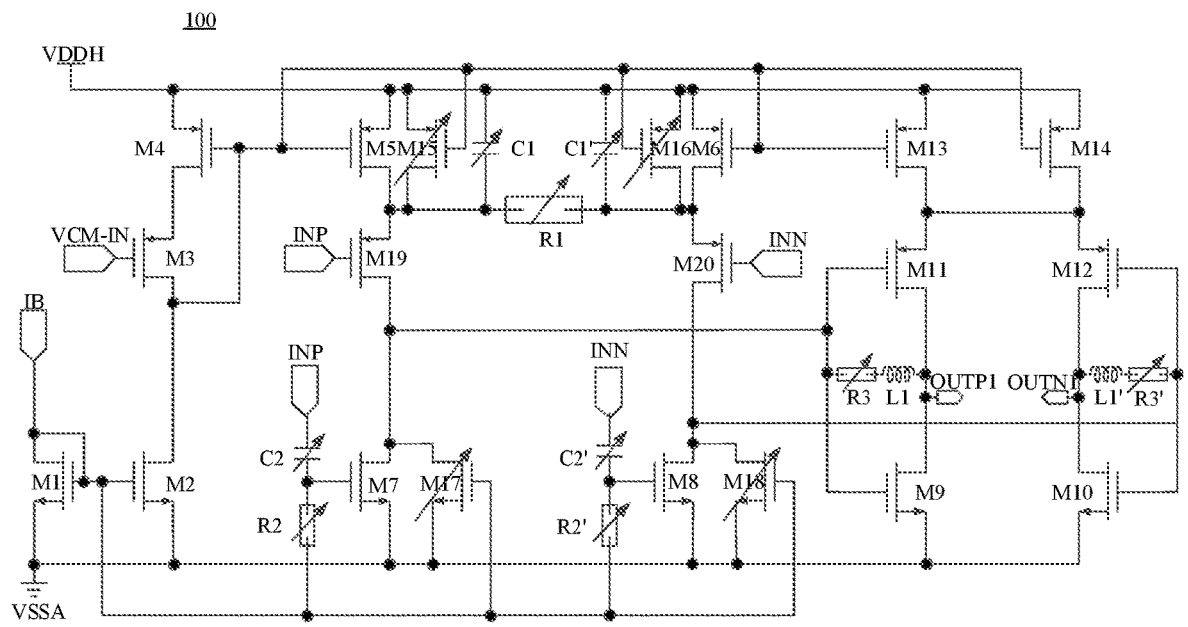
FIG. 1 shows a schematic diagram of the first stage of a circuit for improving linearity and channel compensation of PAM4 receiver analog front end in an embodiment of the present invention.
Figure 2:
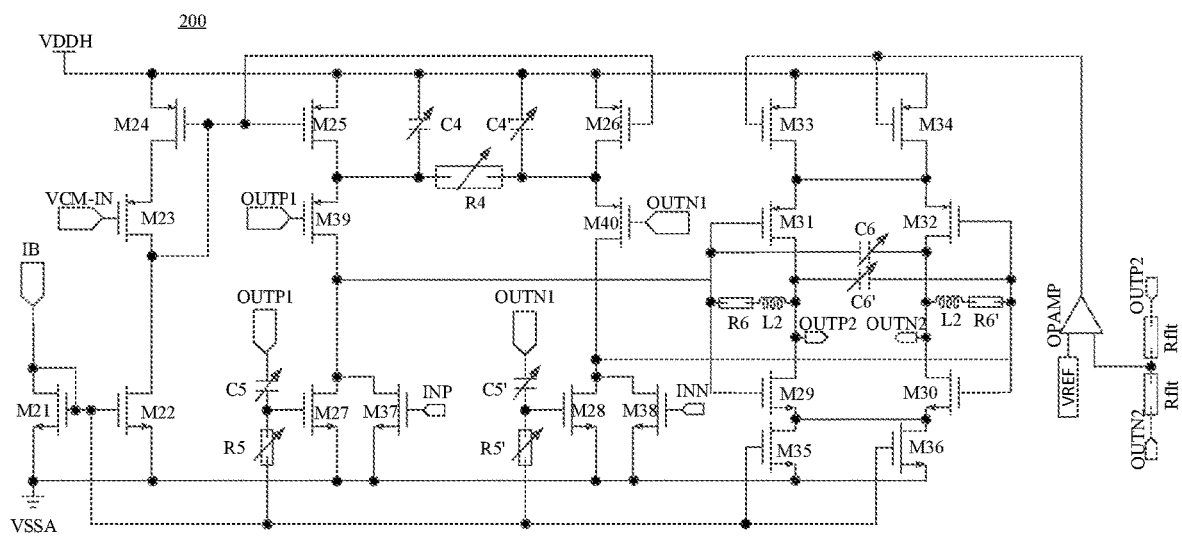
FIG. 2 shows a schematic diagram of the second stage of a circuit for improving linearity and channel compensation of PAM4 receiver analog front end in an embodiment of the present invention.

The present invention discloses a circuit for improving linearity and channel compensation of PAM4 receiver analog front end. The circuit for linearity and channel compensation includes a first stage and a second stage. FIG. 1 shows a schematic diagram of the first stage 100 of an embodiment of the present invention of the circuit for improving linearity and channel compensation of PAM4 receiver analog front end, and FIG. 2 shows a schematic diagram of the first stage 200 of an embodiment of the present invention of the circuit for improving linearity and channel compensation of PAM4 receiver analog front end.

The first stage 100 includes twenty transistors M1 to M20, a first resistor R1, a pair of second resistors R2 and R2', a pair of first capacitors C1 and C1', and a pair of second capacitors C2 and CT.

The drain and gate of the first transistor M1, the gate of the second transistor M2, one end of each of the second resistors R2, the gate of the seventeenth transistor M17, and the gate of the eighteenth transistor M18 are coupled to a bias current IB.

The drain of the second transistor M2, the drain of the third transistor M3, the gates of the fourth to sixth transistors M4-M6, and the gates of the thirteenth to sixteenth transistors M13-M16 are coupled. The gate of the third transistor M3 is coupled to the common mode voltage VCM-IN. The use of the M7/M8 low voltage structure and the change in bias current of the M15/M16/M17/M18 transistors in the first stage circuit 100 can change the gain of the low frequency in the circuit.

The source of the fourth to sixth transistors M4-M6, the source of the thirteenth to sixteenth transistors M13-M16, and one end of the pair of first capacitors C1 and C1' are coupled to the voltage source VDDH.

The drain of transistor M5 and the drain of transistor M15, and the source of transistor M19, the other end of the first capacitor C1 are coupled to one end of the first resistor R1. The drain of transistor M6 and the drain of transistor M16, and the source of transistor M20, the other end of the first capacitor C1' are coupled to the other end of the first resistor R1.

The drain of transistor M19, the gate of transistor M9, and the gate of transistor M11 are coupled to the drain of transistor M7 and the drain of transistor M17. The drain of transistor M20, the gate of transistor M10, and the gate of transistor M12 are coupled to the drain of transistor M8 and the drain of transistor M18.

The gate of transistor M7 is coupled to the other end of the second resistor R2 and one end of the second capacitor C2. The gate of transistor M8 is coupled to the other end of the second resistor R2' and one end of the second capacitor CT.

The gate of transistor M19 and the other end of the second capacitor C2 are coupled to the in-phase input signal INP, and the gate of transistor M20 and the other end of the second capacitor CT are coupled to the anti-phase input signa INN.

The source of transistor M11 and the source of transistor M12 are coupled to the drain of transistor M13 and the drain of transistor M14. The drain of transistor M9 is coupled to the drain of transistor M11, and outputs the first-stage in-phase output signal OUTP1. The drain of transistor M10 is coupled to the drain of transistor M12, and outputs the first-stage anti-phase output signal OUTN1.

The source of transistor M1, the source of transistor M2, the source of transistor M7-M10, and the source of transistor M17 and the source of transistor M18 are coupled to the ground VS SA.

In the first stage circuit 100, the transistor pair M9/M10 is directly coupled to the ground, and the electrical connection to the current source IB is eliminated. The input of the M9/M10 transistor pair is coupled to the output signal of the previous stage M19/M20 transistor pair, making the M9/M10 transistor pair both an input pair and a current source. The overall current is limited by the M13/M14 transistors, allowing the power supply voltage of the first stage consisting of the M9/M10/M11/M12/M13/M14 transistors to be lower.

The source of transistor M7 and the source of transistor M8 in the first stage circuit 100 are directly coupled to the ground, eliminating the electrical connection to the current source IB, allowing the circuit to operate at low power supply voltage. The input of the M7/M8 transistor pair in the first stage circuit is coupled through R2/R2' to the bias current IB, and through C2/C2' to the input signal INP. As a result, the M7/M8 transistors serve as both bias current transistors and input differential pairs. This circuit structure provides an additional zero point. In the first stage circuit 100, consisting of the bias voltage, the second resistor R2/R2', the second capacitor C2/C2', and the M7/M8 transistors, adjusting the size of R2/R2' and C2/C2' can provide zero points at different frequencies.

In the first stage structure, M7/M8 constitutes the input stage of the NMOS, and the DC operating point of M7/M8 is a bias voltage. Due to the presence of C2/C2', there is a zero point in the input of M7/M8. High frequency signals can be amplified through M7/M8, while low frequency signals cannot be amplified through C2/C2'. Low frequency signals can only be amplified through the above input differential pair transistors M19/M20, resulting in poor signal linearity after amplification of the input signal.

In an embodiment, a pair of first capacitors C1 and C1' are variable capacitors, and the first resistor R1 is a variable resistor. In an embodiment, a pair of second capacitors C2 and CT are variable capacitors, and a pair of second resistors R2 are variable resistors.

In an embodiment, the first stage 100 also includes a pair of third resistors R3 and R3', with R3 coupled in series between the drain and gate of transistor M11, and R3' coupled in series between the drain and gate of transistor M12.

In an embodiment, the first stage 100 also includes a pair of first inductors L1 and L1', with L1 coupled in series between the drain and gate of transistor M11, and L1' coupled in series between the drain and gate of transistor M12.

In an embodiment, the second stage 200 includes transistors M21-M40, the fourth resistor R4, a pair of fifth resistors R5 and R5', a pair of fourth capacitors C4 and C4', and a pair of fifth capacitors C5 and C5'.

The drain and gate of transistor M21, the gate of transistor M22, one end of the fifth resistors R5 and R5', and the gates of transistors M35-M38 are coupled to the bias current IB.

The drain of the 22nd transistor M22 and the drain of the 23rd transistor M23 are coupled to the gates of the 24th to 26th transistors M24-M26. The gate of the 23rd transistor M23 is coupled to the common mode voltage VCM-IN.

The sources of the 24th to 26th transistors M24-M26 and the sources of the 33rd to 34th transistors M34 are coupled to one end of the fourth capacitors C4, C4' and coupled to the voltage source VDDH.

The drain of the 25th transistor M25, the source of the 39th transistor M39, and the other end of the fourth capacitor C4 are coupled to one end of the fourth resistor R4. The drain of the 26th transistor M26, the source of the 40th transistor M40, and the other end of the fourth capacitor C4 are coupled to the other end of the fourth resistor R4.

The drain of transistor M39, the gates of transistors M29 and M31 are coupled to the drains of transistors M27 and M37. The drain of transistor M40, the gates of transistors M30 and M32 are coupled to the drains of transistors M28 and M38. The sources of the transistors M27/M28 in the second stage circuit 200 are directly coupled to the ground, eliminating the electrical connection to the current source IB, enabling the circuit to operate at low power supply voltages. The input terminal of the transistors M27/M28 is coupled to the bias current IB through R5/R5' and to the input signal OUTP1 through C5/C5'. As a result, the M27/M28 transistors serve as both bias current transistors and input differential pairs. This circuit structure provides an additional zero point. In the structure composed of bias voltage, the fifth resistor R5/R5', the fifth capacitor C5/C5' and transistors M27/M28, adjusting the size of R5/R5' and C5/C5' can provide zero points at different frequencies.

In the second stage circuit 200, the added transistors M37/M38 form an NMOS input stage with M27/M28. The DC operating point of M27/M28 is set by the bias voltage. Due to the presence of C5/C5', the input of M27/M28 has zero points. High frequency signals can be amplified through M27/M28, while low frequency signals cannot pass through C5/C5'. Low frequency signals can only be amplified through the input differential pair M39/M40 above, resulting in poor signal linearity after amplification of the input signal. The input terminal of the transistors M37/M38 is directly coupled to the signal, and the DC working point operates at the output of the front stage to amplify the low and high frequency signals output from the front stage. Changing the size or type of the transistors M37/M38 can optimize signal output linearity.

The gate of the twenty seventh transistor M27 is coupled to the other end of the fifth resistor R5 and one end of the fifth capacitor C5, and the gate of the twenty eighth transistor M28 is coupled to the other end of the fifth resistor R5' and one end of the fifth capacitor C5'.

The gate of the transistor M39 and the other end of the fifth capacitor C5 are coupled to the first-stage in-phase output signal OUTP1, and the gate of the transistor M40 and the other end of the fifth capacitor C5' are coupled to the first-stage anti-phase output signal OUTN1.

The sources of the transistors M31 and M32 are coupled to the drains of the transistor M33 and M34, the drain of the transistor M31 is coupled to the drain of the transistor M29 and outputs the second-stage in-phase output signal OUTP2. The drain of the transistor M32 is coupled to the drain of the transistor M30 and outputs the second-stage anti-phase output signal OUTN2.

The sources of the 21st transistor M21, the 22nd transistor M22, the 27th transistor M27, the 28th transistor M28, and the 35th to 38th transistors M35-M38 are coupled to the ground VSSA.

In an embodiment, the second stage 200 further comprises a pair of sixth resistors R6 and R6', the sixth resistor R6 being coupled in series between the drain and gate of the thirty first transistor M31, and the sixth resistor R6' being coupled in series between the drain and gate of the thirty second transistor M32.

In an embodiment, the second stage 200 further includes a pair of second inductors L2 and L2', wherein the second inductor L2 is coupled in series between the drain and gate of the thirty first transistor M31, and the second inductor L2' is coupled in series between the drain and gate of the thirty second transistor M32.

In an embodiment, the second stage 200 further includes a pair of sixth capacitors C6 and C6', wherein the capacitors C6 is coupled between the gate of the thirty first transistor M31 and the drain of the thirty second transistor M32, and the capacitor C6' is coupled between the drain of the thirty first transistor M31 and the gate of the thirty second transistor M32. As the output load capacitance is relatively large, in order to increase the bandwidth, a structure is adopted in the second stage 200, consisting of differential transistors M31/M32 and M29/M30, the sixth resistors R6/R6', the second inductors L2/L2', and the sixth capacitors C6/C6' (which are variable capacitors). This structure provides another zero point in addition to the zero point provided by the inductors, and the frequency of this zero point can be changed by adjusting the size of the sixth capacitor C6. In the case of meeting the bandwidth requirements, the second inductor L2 and L2' in the circuit can be removed, and a new zero point can be formed by only using the differential transistors M31/M32 and M29/M30, the sixth resistors R6 and R6', and the sixth variable capacitors C6 and C6'. Thereby expanding the output bandwidth of the circuit.

In an embodiment, the second stage 200 further includes a comparator OPAMP whose output terminal is coupled to the gates of the transistors M33 and M34. The first input of the comparator is coupled to a reference voltage VREF, and the second input is coupled to either the second-stage in-phase output signal OUTP2 or the second-stage anti-phase output signal OUTN2. In the case of PVT, to stabilize the output common-mode voltage, the output stage consists of M33/M34, a comparator output common-mode voltage, and an input reference voltage to form a feedback circuit.

In addition, the second stage circuit 200 may also include transistors M15/M16 in the first stage circuit, which can change the gain at low frequencies in this stage.

Figure 3:
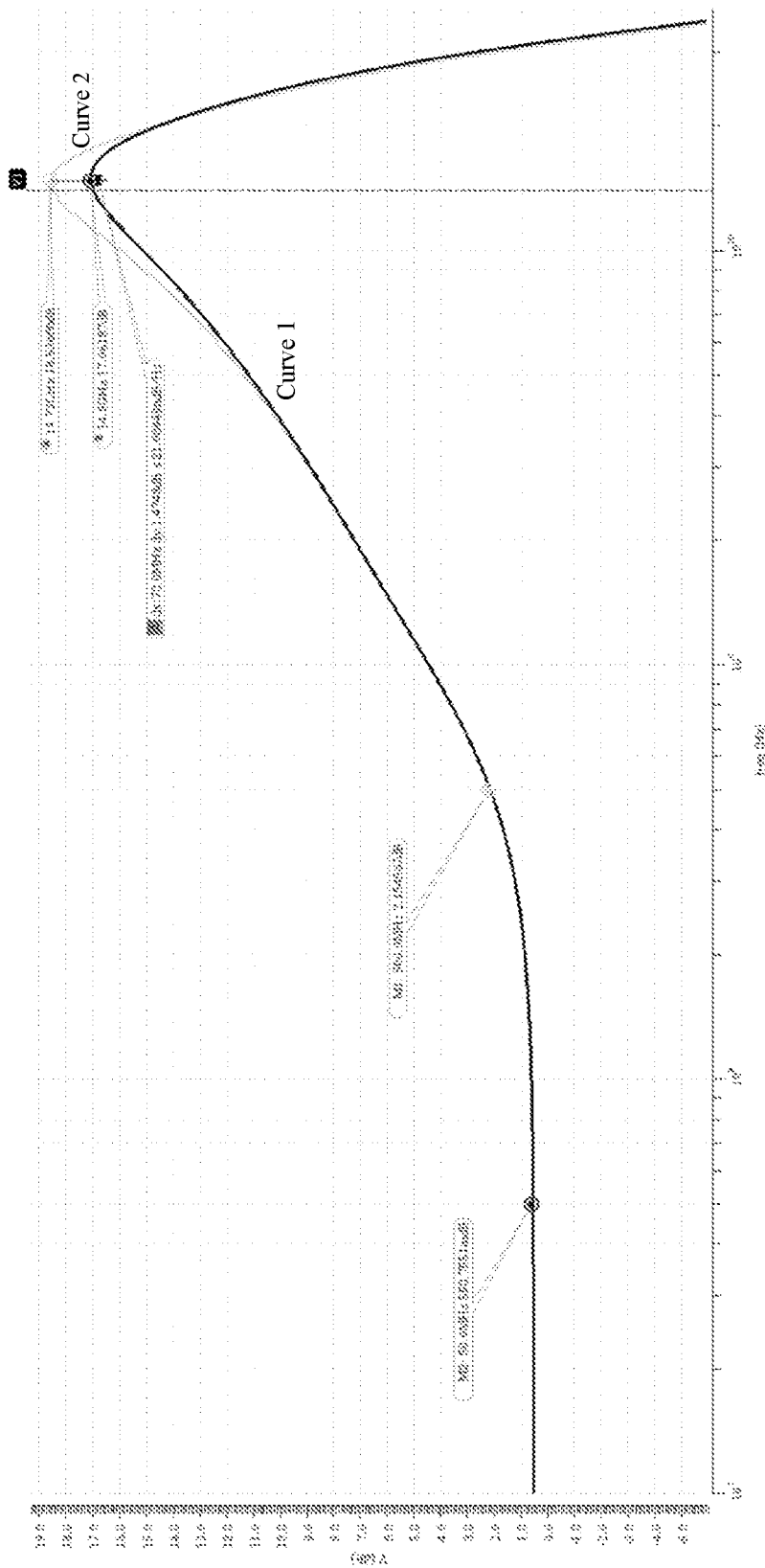
FIG. 3 shows a schematic diagram of simulation results in an embodiment of the present invention.

FIG. 3 shows a simulation result diagram of the present invention. The zero point generated by the added R2/C2 in the first stage is located at low frequency. From the simulation results, it can be seen that the gain of the signal at 500 MHz frequency is significantly larger than at lower frequencies. In the second stage, due to R6/L2 and the added C6, the peak frequency of curve 2 is significantly higher than that of curve 1, and the peak value is pushed up by nearly 1.5 dB according to the simulation results.

It should be noted that in the application document of this patent, terms such as "first" and "second" are used only to distinguish one entity or operation from another, and do not necessarily imply any actual relationship or order between these entities or operations. Moreover, the terms "comprise," "include," or any other variations thereof are intended to encompass non-exclusive inclusion, such that a process, method, article, or device comprising a series of elements includes not only those elements but also additional elements not explicitly listed or inherently included for such process, method, article, or device. Unless specifically limited, the term "comprising a" does not exclude the possibility of including other identical elements in the process, method, article, or device that comprises the one element. When a behavior is performed according to a certain element in the application document of this patent, it means at least that the behavior is performed according to the element, including two situations: performing the behavior only according to the element, and performing the behavior according to the element and other elements. Expressions such as "multiple," "repeated," "various," etc., include 2, 2 times, 2 types, as well as 2 or more, 2 times or more, 2 types or more.

The terms "coupled to" and its derivatives may be used herein. "Coupled" may indicate direct physical or electrical contact between two or more components. However, "coupled" may also mean that two or more components are indirectly in contact with each other but still cooperate or interact with each other, and may mean that one or more other components are coupled or coupled between the elements called coupling.

This specification includes combinations of various embodiments described herein. The individual reference to embodiments (such as "an embodiment" or "some embodiments" or "preferred embodiments") is not necessarily referring to the same embodiments. However, unless otherwise indicated or clearly understood by those skilled in the art, these embodiments are not mutually exclusive.

It should be noted that all documents mentioned in this specification are considered to be included in the disclosure of this application as a whole, so that they can be used as a basis for modification if necessary. In addition, it should be understood that the foregoing is merely exemplary of the principles and applications of the present specification and is not intended to limit the scope of the specification. Any modifications, equivalents, improvements, etc., made within the spirit and principles of one or more embodiments of this specification should be included within the scope of one or more embodiments of this specification.

What is claimed is:

1. A circuit for improving linearity and channel compensation of PAM4 receiver analog front end, comprising a first stage which comprises: first to twentieth transistors, a first resistor, a pair of second resistors, a pair of first capacitors, and a pair of second capacitors; wherein, the drain and gate of the first transistor, the gate of the second transistor, one end of each of the pair of second resistors, the gate of the seventeenth transistor and the gate of the eighteenth transistor are coupled with a bias current;

the drain of the second transistor, the drain of the third transistor, the gate of the fourth to sixth transistors are coupled to the gate of the thirteenth to sixteenth transistors;

the gate of the third transistor is coupled with a common mode voltage;

the source of the fourth to sixth transistors, the source of the thirteenth to sixteenth transistors, one end of each of the pair of first capacitors are coupled with a voltage source;

the drain of the fifth and fifteenth transistors, the source of the nineteenth transistor, one end of one of the pair of first capacitors is coupled to one end of the first resistor, the drain of the sixth and sixteenth transistors, the source of the twentieth transistor, one end of the other of the pair of first capacitors is coupled to the other end of the first resistor;

the drain of the nineteenth transistor, the gate of the ninth and eleventh transistors are coupled to the drain of the seventh and seventeenth transistors, the drain of the twentieth transistor, the gate of the tenth and twelfth transistors are coupled to the drain of the eighth and eighteenth transistors;

the gate of the seventh transistor is coupled to the other end of one of the pair of second resistors and one end of one of the pair of second capacitors, the gate of the eighth transistor is coupled to the other end of the other of the pair of second resistors and one end of the other of the pair of second capacitors;

the gate of the nineteenth transistor and the other end of one of the pair of second capacitors are coupled to the in-phase input signal, the gate of the twentieth transistor and the other end of the other of the pair of second capacitors are coupled to the anti-phase input signal;

the source of the eleventh and twelfth transistors are coupled to the drain of the thirteenth and fourteenth transistors, the drain of the eleventh transistor is coupled to the drain of the ninth transistor and outputs a first-stage in-phase output signal, the drain of the twelfth transistor is coupled to the drain of the tenth transistor and outputs a first-stage anti-phase output signal;

the source of the first, second, seventh to tenth, seventeenth and eighteenth transistors are coupled to ground.

2. The circuit for improving linearity and channel compensation of PAM4 receiver analog front end of claim 1, wherein the pair of first capacitors are variable capacitors, and the first resistor is a variable resistor.

3. The circuit for improving linearity and channel compensation of PAM4 receiver analog front end of claim 1, wherein the pair of second capacitors are variable capacitors, and the pair of second resistors are variable resistors.

4. The circuit for improving linearity and channel compensation of PAM4 receiver analog front end of claim 1, the first stage further comprising a pair of third resistors, wherein one of the pair of third resistors is coupled in series between the drain and gate of the eleventh transistor, and the other of the pair of third resistors is coupled in series between the drain and gate of the twelfth transistor.

5. The circuit for improving linearity and channel compensation of PAM4 receiver analog front end of claim 1, the first stage further comprising a pair of first inductors, wherein one of the pair of first inductors is coupled in series between the drain and gate of the eleventh transistor, and the other of the pair of first inductors is coupled in series between the drain and gate of the twelfth transistor.

6. The circuit for improving linearity and channel compensation of PAM4 receiver analog front end of claim 1, further comprising a second stage which comprises: twenty-first through fortieth transistors, a fourth resistor, a pair of fifth resistors, a pair of fourth capacitors, and a pair of fifth capacitors; wherein, the drain and gate of the twenty-first transistor, the gate of the twenty-second transistor, one end of each of the pair of fifth resistors, and the gates of the thirty-fifth through thirty-eighth transistors are coupled to a bias current;

the drain of the twenty-second transistor, the drain of the twenty-third transistor, and the gates of the twenty-fourth through twenty-six transistors are coupled;

the gate of the twenty-third transistor is coupled to a common mode voltage;

the sources of the twenty-fourth through twenty-six transistors, the sources of the thirty-third through thirty-four transistors, and one end of each of the pair of fourth capacitors are coupled to a voltage source;

the drain of the twenty-fifth transistor, the source of the thirty-ninth transistor, and the other end of one of the pair of fourth capacitors are coupled to one end of the fourth resistor, and the drain of the twenty-sixth transistor, the source of the fortieth transistor, and the other end of the other of the pair of fourth capacitors are coupled to the other end of the fourth resistor;

the drain of the thirty-ninth transistor and the gates of the twenty-ninth and thirty-first transistors are coupled to the drains of the twenty-seventh and thirty-seventh transistors, and the drain of the fortieth transistor, the gates of the thirtieth and thirty-second transistors are coupled to the drains of the twenty-eighth and thirty-eighth transistors;

the gate of the twenty-seventh transistor is coupled to the other end of one of the pair of fifth resistors and one end of one of the pair of fifth capacitors, and the gate of the twenty-eighth transistor is coupled to the other end of the other of the pair of fifth resistors and one end of the other of the pair of fifth capacitors;

the gate of the thirty-ninth transistor and the other end of one of the pair of fifth capacitors are coupled to the first-stage in-phase output signal, and the gate of the fortieth transistor and the other end of the other of the pair of fifth capacitors are coupled to the first-stage anti-phase output signal;

the sources of the thirty-first and thirty-second transistors are coupled to the drains of the thirty-third and thirty-fourth transistors, and the drain of the thirty-first transistor is coupled to the drain of the twenty-ninth transistor to output the second-stage in-phase output signal, and the drain of the thirty-second transistor is coupled to the drain of the thirtieth transistor to output the second-stage anti-phase output signal;

the sources of the twenty-first, twenty-second, twenty-seventh, twenty-eighth, thirty-fifth through thirty-eighth transistors are coupled to ground.

7. The circuit for improving linearity and channel compensation of PAM4 receiver analog front end of claim 6, wherein the second stage further comprises a pair of sixth resistors, wherein one of the pair of sixth resistors is coupled in series between the drain and gate of the thirty-first transistor, and the other of the pair of sixth resistors is coupled in series between the drain and gate of the thirty-second transistor.

8. The circuit for improving linearity and channel compensation of PAM4 receiver analog front end of claim 6, wherein the second stage further comprises a pair of second inductors, wherein one of the pair of second inductors is coupled in series between the drain and gate of the thirty-first transistor, and the other of the pair of second inductors is coupled in series between the drain and gate of the thirty-second transistor.

9. The circuit for improving linearity and channel compensation of PAM4 receiver analog front end of claim 6, wherein the second stage further comprises a pair of sixth capacitors, wherein one of the pair of sixth capacitors is coupled between the gate of the thirty-first transistor and the drain of the thirty-second transistor, and the other of the pair of sixth capacitors is coupled between the drain of the thirty-first transistor and the gate of the thirty-second transistor.

10. The circuit for improving linearity and channel compensation of PAM4 receiver analog front end of claim 6, wherein the second stage further comprises a comparator, whose output terminal is coupled to the gate of the thirty-third and thirty-fourth transistors, whose first input terminal is coupled to a reference voltage, and whose second input terminal is coupled to the second-stage anti-phase output signal or the second-stage in-phase output signal.

* * * * *